(12) United States Patent
Litten et al.

(10) Patent No.: US 7,823,035 B2
(45) Date of Patent: Oct. 26, 2010

(54) SYSTEM AND METHODS OF BALANCING SCAN CHAINS AND INSERTING THE BALANCED-LENGTH SCAN CHAINS INTO HIERARCHICALLY DESIGNED INTEGRATED CIRCUITS

(75) Inventors: David D. Litten, Jericho, VT (US);
Steven F. Oakland, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 653 days.

(21) Appl. No.: 11/748,736

(22) Filed: May 15, 2007

(65) Prior Publication Data

US 2008/0288841 A1 Nov. 20, 2008

(51) Int. Cl.
*G01R 31/28* (2006.01)
*G06F 17/50* (2006.01)

(52) U.S. Cl. .................. 714/729; 714/741; 716/4
(58) Field of Classification Search ............... 714/724, 714/726, 727, 729, 741; 716/4
See application file for complete search history.

(56) References Cited

U.S. PATENT DOCUMENTS

| | | | | |
|---|---|---|---|---|
| 5,428,622 A | * | 6/1995 | Kuban et al. | 714/729 |
| 5,606,566 A | * | 2/1997 | Whetsel | 714/729 |
| 5,719,878 A | * | 2/1998 | Yu et al. | 714/726 |
| 5,949,692 A | | 9/1999 | Beausang et al. | |
| 6,519,729 B1 | * | 2/2003 | Whetsel | 714/727 |
| 6,654,920 B1 | * | 11/2003 | Hetherington et al. | 714/733 |
| 6,665,828 B1 | | 12/2003 | Arimilli et al. | |
| 6,681,356 B1 | * | 1/2004 | Gerowitz et al. | 714/729 |
| 7,032,202 B2 | | 4/2006 | Guettaf et al. | |
| 7,197,681 B2 | * | 3/2007 | Dervisoglu et al. | 714/726 |

OTHER PUBLICATIONS

"Optimal configuring of multiple scan chains" by Narayanan et al. This paper appears in: Computers, IEEE Transactions on Publication Date: Sep. 1993 vol. 42, Issue: 9 On pp. 1121-1131 ISSN: 0018-9340 INSPEC Accession No. 4580572.*
International Search Report and Written Opinion for International Application No. PCT/US08/61526.

* cited by examiner

*Primary Examiner*—Cynthia Britt
(74) *Attorney, Agent, or Firm*—Richard Kotulak; Roberts Mlotkowski Safran & Cole, P.C.

(57) ABSTRACT

A system and methods of balancing scan chains and, more particularly, a system and methods of load balancing scan chains into hierarchically designed integrated circuits. The method includes estimating or calculating a maximum scan chain length L and creating a maximum number of scan chains of length L in each hierarchical block. The method further includes distributing remaining scan bits in each hierarchical block into additional scan chains, and creating chip-level scan chains by using the scan chains of maximum length L and by forming additional chip-level scan chains of maximum length L by distributing the additional scan chains of maximum length LR, plus any remaining top-level scan bits, among the additional chip-level scan chains of maximum length L.

28 Claims, 4 Drawing Sheets

SYSTEM AND METHODS OF BALANCING SCAN CHAINS AND INSERTING THE BALANCED-LENGTH SCAN CHAINS INTO HIERARCHICALLY DESIGNED INTEGRATED CIRCUITS

FIELD OF THE INVENTION

The present invention relates to a system and methods of balancing scan chains and, more particularly, the invention relates to a system and methods of load balancing scan chains into hierarchically designed integrated circuits.

BACKGROUND DESCRIPTION

Scan chains are a technique used in "Design For Test" to provide a simple way to set and observe every flip-flop in an integrated circuit (IC). By using scan chains, each integrated circuit can be tested to validate that the product hardware contains no defects that could adversely affect the designed functioning of the product.

Tests generally are driven by test programs that execute in Automatic Test Equipment (ATE) such as an automatic test pattern generation (ATPG) tool. The ATPG is an electronic design automation tool used to find an input (or test) sequence that, when applied to a digital circuit, enables testers to distinguish between the correct circuit behavior and the faulty circuit behavior caused by a particular fault.

Tests are applied to integrated circuits by loading the IC's scan chains with a test pattern, applying one or more clocks, and then unloading the responses from the scan chains. This process is repeated many thousands, of times, with the length of the longest scan chain typically dictating the number of tester cycles required for loading/unloading scan chains. And, as is known, the test cost is directly related to test time which, in turn, is directly related to the length of the longest scan chain. For example, longer scan chains require longer load and unload times thus increasing the overhead costs.

Given the fact that the test cost is directly related to the test time, it is ideal to minimize the longest scan chain. For this reason, given a fixed number of scan chains, the length of the longest scan chain is typically minimized when all scan chains are of equal length. While it may be impractical to achieve scan chains of exactly equal length, it is desirable to balance the lengths of scan chains such that the maximum length is only a few percent longer than the average length. In one example, scan chains may be considered to be balanced if they are within a 3% variance, e.g., of the average length.

In known implementations, some scan chains may be significantly shorter than average, even zero length, and still result in "balanced" scan chains. For example, a hypothetical design with 100,000 scan cells distributed among 100 scan chains can have 97 scan chains of length 1030, one scan chain of length 90, and two scan chains of length 0, and still have scan chains balanced within 3%. In other words, the longest chain is 3% (1030) larger than the average length (1000).)

Also, until recently, the number of scan chains on an IC was limited by the number of pins available to be used for scan or by the test equipment used for testing the IC. (The number of scan chains was typically 16-32.) However, with the advent of on-chip test data compression and decompression methods, the number of scan chains has increased roughly 20 times. For this reason, it is not unusual to have five or six hundred scan chains; instead of the typical 16-32 scan chains.

Existing tools are capable of generating equal-length scan chains when given complete freedom to apportion scan bits among the available scan chains. However, when some scan bits are already pre-connected into scan segments, and the tool is not given the freedom to break up those pre-connected segments, results are not always optimum. With this noted, hierarchical designs present a particular problem to these tools.

In hierarchical designs, the scan must be inserted into each hierarchical block or module, and then the pre-connected segments are stitched together with top-level scan bits to form chip-level scan chains. That is, scan chains are created for each block and then stitched together to form the chip level scan chains. There are two known processes for attempting to achieve balanced-length scan chains in hierarchical designs, both of which have their shortcomings as discussed below.

In a first process (process "1"), given that the product is specified to have N scan chains, the process will create N near-equal-length scan chains on each hierarchical block. At the top level of the design, the process will stitch the hierarchical block scan chains together and distribute any top-level scan bits equally among the N scan chains This works well for cases where the number of scan bits in each hierarchical block is much greater than N, and when N is not more than a few dozen.

In another process (process "2"), for cases where the number of scan bits in a hierarchical block is not significantly greater than N, the process will create near-equal-length scan chains. In this process, the longest scan chain does not exceed some limit (e.g., 400 scan bits). As long as this limit is small, relative to the total number of scan bits in the entire design, the scan chains can be fairly-well balanced by using known methods at the top level, to stitch scan chains of the hierarchical blocks together to form the desired number of chip-level scan chains.

However, both of these processes (i.e., process "1" and process "2") require an excessive number of scan pins on each hierarchical block. For example, a hierarchical block with 20,000 scan bits in a design that is to have 500 scan chains would be required to have 1000 scan pins using process "1" or 100 scan pins using process "2" (with a limit of 400 bits per chain).

Accordingly, there exists a need in the art to overcome the deficiencies and limitations described hereinabove.

SUMMARY OF THE INVENTION

In a first aspect of the invention, a method for inserting balanced-length scan chains into hierarchically designed integrated circuits, comprises: estimating or calculating a maximum scan chain length L; creating a maximum number of scan chains of length L in each hierarchical block; distributing any remaining scan bits in each hierarchical block into additional scan chains of maximum length LR which is less than L; and creating chip-level scan chains by using the scan chains of maximum length L and by forming additional chip-level scan chains of maximum length L by distributing the additional scan chains of maximum length LR, plus any remaining top-level scan bits, among the additional chip-level scan chains of maximum length L.

In embodiments, the estimating or calculating is provided for each block in the hierarchically designed integrated circuit. The estimating or calculating uses information about a design of the hierarchically designed integrated circuit to estimate or calculate the maximum scan chain length L. The information includes at least one of number of scan bits, number of scan chains and balancing criterium. The method further comprises creating a minimum number of additional chip-level scan chains of maximum length L. The additional chip-level scan chains of maximum length L are created by dividing the remaining scan bits equally or substantially equally among a desired number of scan chains. The maximum scan chain length L is no more than a predetermined percentage of an average length. The scan chain length is balanced in the hierarchically designed integrated circuit.

In another aspect of the invention, the method comprising calculating a maximum scan chain length L and dividing a total number of scan bits $B_i$ by the maximum scan chain length L for each hierarchical, block i (i=1, 2, . . . , m) to create $M_i$ scan chains. The method further includes creating remainder scan chains from scan bits $R_i$ remaining from the dividing, and stitching together the scan chains and the remainder scan chains at a top level to form stitched scan chains not exceeding a maximum length.

In embodiments the stitching comprises specifying "N" number of scan chains to be created at the top level. In other embodiments, the stitching comprises specifying a maximum length of the scan chains to be created at the top level. In this case, the total number of scan chains created may be less than N. The number of scan chains created is equal to a rounding up of a total number of scan bits in an entire design divided by L or a rounding up of N divided by a target scan-balancing factor for the entire design (F). The Mi scan chains have lengths as close to, but not exceeding, the maximum scan chain length L. The maximum scan chain length L is load balanced.

The method further comprises providing a total number of scan bits in a hierarchical block ($B_i$) and a maximum length of remainder scan chains (LR). The remainder scan chains do not exceed a predetermined length LR. The remaining scan bits $R_i$ are distributed equally or substantially equally to create the remainder scan chains.

In further embodiments, the method further comprises determining a maximum length for each of the remainder scan chains $R_i$ and minimizing a number of the remainder scan chains. The calculating is based on equation $L=(T/N) \times F$, wherein:

T=total number of scan bits in the entire design

N=desired number of scan chains to be inserted into the design; and

F=target scan-balancing factor for the design.

In still further embodiments, the dividing step comprises calculating a minimum length ML of the scan chain using equation ML=T/N, wherein:

T=total number of scan bits in the entire design; and

N=total number of scan chains to be inserted into the design.

The minimum length ML includes a load balancing factor. The method steps are used to manufacture semiconductor devices.

In another aspect of the invention, a system for inserting balanced-length scan chains into hierarchically designed integrated circuits comprises a computer infrastructure operable to: calculate a maximum scan chain length L of scan bits; create Mi scan chains of the maximum scan chain length L, which results in a remaining number of scan bits; create remainder scan chains from the remaining number of scan bits; and stitch together the scan chains and the remainder scan chains at a top level.

In further embodiments, the computer infrastructure is operable to specify a maximum length of the scan chains to be created at the top level. The computer infrastructure is operable to create a total number of scan chains less than N, where N is equal to a rounding up of a total number of scan bits in an entire design divided by L or a rounding up of N divided by a target scan-balancing factor for the entire design (F). The computer infrastructure is operable to create the Mi scan chains which lengths as close to, but not exceeding, the maximum scan chain length L. The computer infrastructure is operable to load balance the maximum scan chain length L.

In yet another aspect of the invention, a computer program product comprises a computer usable medium having a computer readable program embodied in the medium. The computer readable program when executed on a computing device is operable such that the computing device can: estimate or calculate a maximum scan chain length L; create a maximum number of scan chains of length L in each hierarchical block; distribute remaining scan bits in each hierarchical block into additional scan chains; and create chip-level scan chains by distributing scan segments of maximum length LR among a minimum number of additional chip-level chains of maximum length L using the scan chains of length L and the additional scan chains.

BRIEF DESCRIPTION OF THE DRAWINGS

The present invention is described in the detailed description which follows, in reference to the noted plurality of drawings by way of non-limiting examples of exemplary embodiments of the present invention, wherein.

DETAILED DESCRIPTION OF THE INVENTION

The present invention relates to a system and methods of balancing scan chains and, more particularly, the invention relates to a system and methods of load balancing scan chains in hierarchically designed integrated circuits. In more particular embodiments, the invention is configured to stitch together "remaining" scan chains from blocks of a hierarchically designed integrated circuit into balanced chip-level scan chains. The balanced chip level scan chains are then inserted into the hierarchically designed integrated circuits. In this manner, it is possible, by implementing the methods and system of the invention, to reduce top-level wiring.

In embodiments, the system and methods of the invention create as many "long" scan chains as possible within each block of a hierarchically designed integrated circuit. In embodiments, the scan chains are sufficiently long that top-level processing will not add any scan cells to these scan chains. Any flops in each block that are not assigned to the "long" scan chains are deemed remainders and are assigned to "shorter" scan chains of a predetermined length. At the top-level, a subset of the top-level scan chains are created with the "long" scan chains in the blocks. The remaining flops and any "shorter" scan chains are assigned to remaining top-level scan chains using a conventional "load-balancing" algorithm. In this way, it is possible to stitch together balanced scan chains at the chip level, which reduces the number of scan chains and, in particular, the number of short scan chains at the chip level.

Several tools can be used with the invention. The tools for inserting scan chains vary in design, but typically take two forms. In the first type of tool (tool "1"), the user specifies the desired number of scan chains and the tool divides the scan bits in the design equally (or as "equally" as possible) among the desired number of scan chains. In the second type of tool (tool "2"), the user specifies the desired maximum length scan chain and the tool calculates the minimum number of scan chains, based on the total number of scan bits in the design. Once this is accomplished, the processes of tool "2" revert to the processes of tool "1" to apportion the scan bits equally among those scan chains.

System Environment

Figure 1:
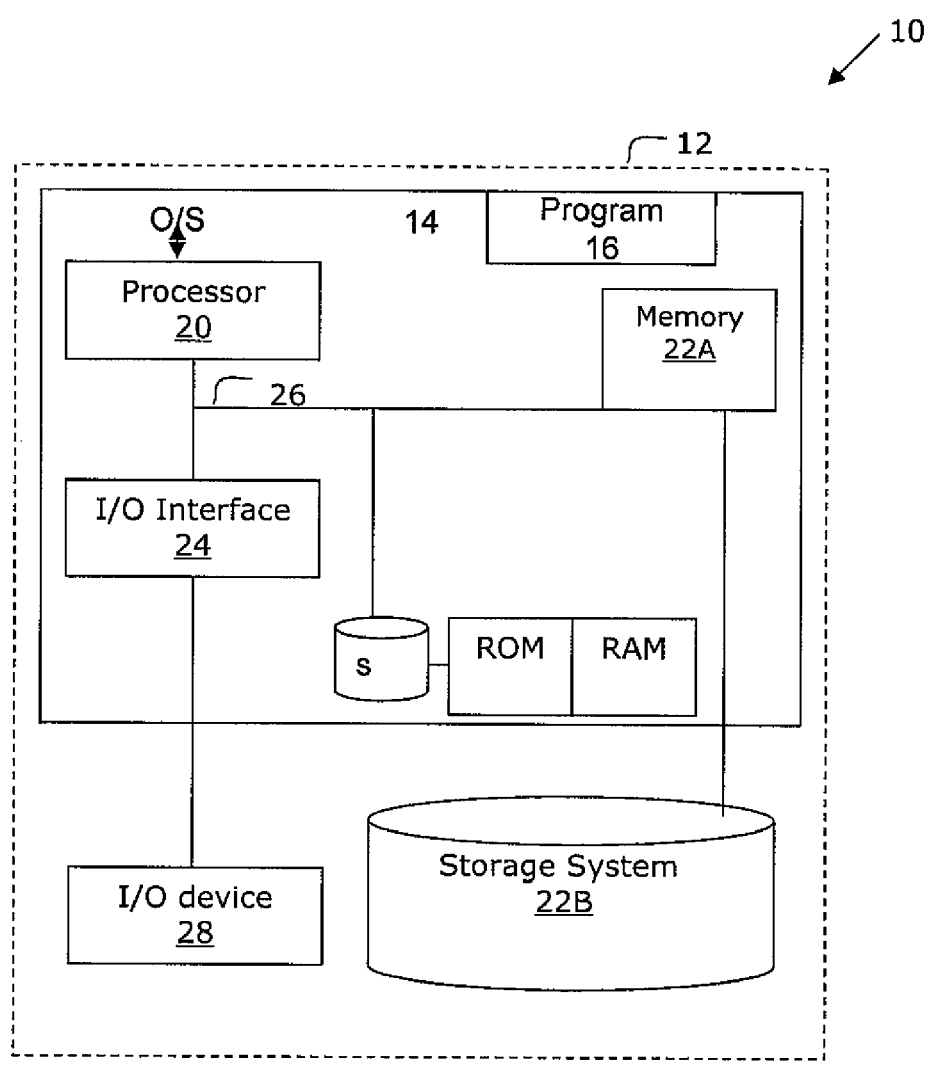
FIG. 1 shows an environment for implementing the processes in accordance with the invention.

FIG. 1 shows an illustrative environment 10 for managing the processes in accordance with the invention. The illustrative environment 10 is a design-for-test (DFT) tool configured to balance the scan chains and insert the balanced scan chains into hierarchically designed integrated circuits.

The environment includes a computer infrastructure 12 having a computing device 14. The computing device 14 includes program 16, which is configured and structured to, amongst other processes, create N number of scan chains of a predetermined length for each block in hierarchically designed integrated circuits. The computing device 14 is further configured such that any remaining flops that could not be assigned within the N number of scan chains of a predetermined length will be assigned to shorter scan chains of predetermined length. By using the shorter scan chains, the computer device 14, when creating scan chains at the chip level, can stitch together the shorter scan chains to create one or more longer scan chains of predetermined length. Thus, by stitching together the shorter scan chains, at the chip level, it is possible to reduce the number of scan chains and, in particular, the number of short scan chains at the chip level. In this way, the computing device can insert balanced scan chains into hierarchically designed integrated circuits. (The process of the invention are discussed in more detail with reference to FIGS. 2-4, each of which can be implemented by the computing device 14.)

Still referring to FIG. 1, in embodiments, the program 16 includes executable code, which may be stored temporarily or permanently in memory 22A. The executable code is representative of the process flows of the invention; that is, the executable code is configured to implement the processes of the invention. Memory 22A can include local memory employed during actual execution of program code, bulk storage, and cache memories which provide temporary storage of at least some program to reduce the number of times code must be retrieved from bulk storage during execution.

The computer infrastructure 12 further includes input/output (I/O) interface 24, bus 26, Storage "S", ROM, RAM and external I/O device/resource 28. The storage "S" may be any type of appropriate database. The external I/O device/resource 28 may be a keyboard, display, pointing device, etc.

The processor 20 executes the computer program code and logic of the system and method of the invention, which is stored in the memory 22A. While executing the computer program code, etc., the processor 20 can read and/or write data to/from the memory 22A, the storage system 22B, the storage "S" and/or the I/O interface 24. The bus 26 provides a communications link between each of the components in the computing device 14.

Flow Diagram Implementing Steps of the Invention

Figure 2:
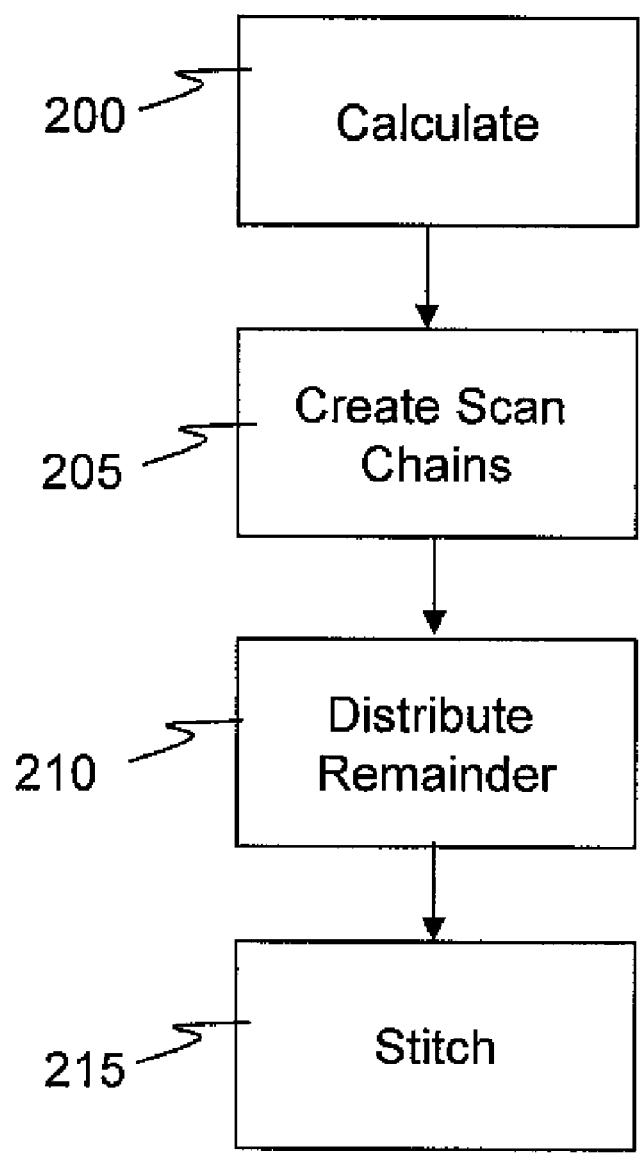
FIG. 2 is a flow chart implementing processes in accordance with embodiments of the invention.
Figure 3:
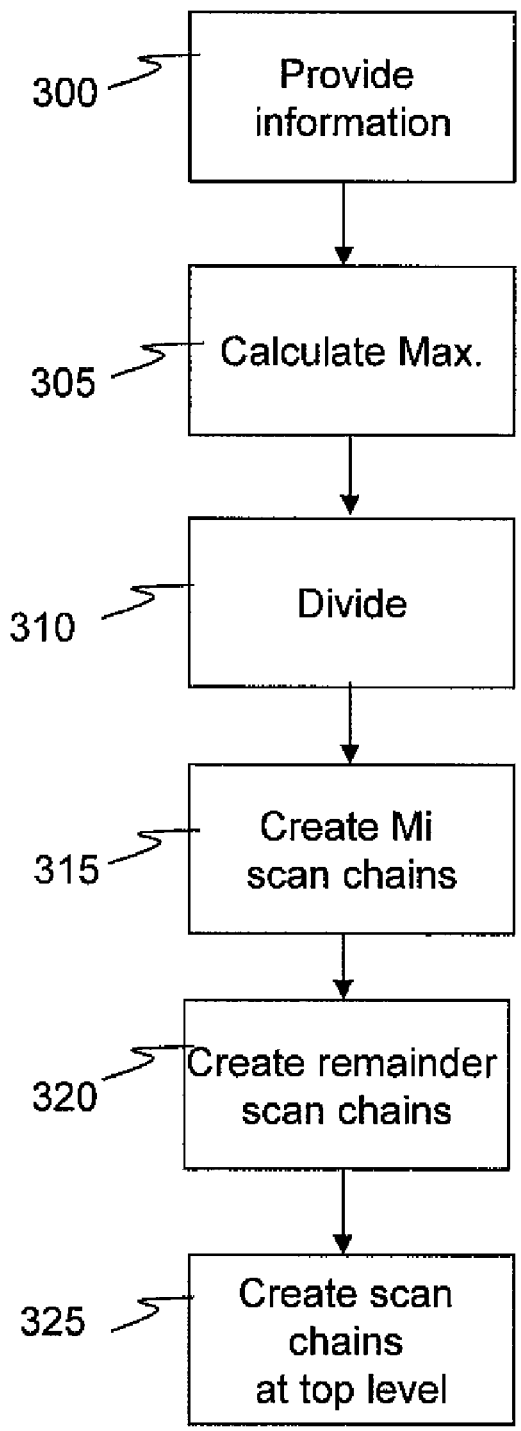
FIG. 3 is a flow chart implementing processes in accordance with embodiments of the invention.
Figure 4:
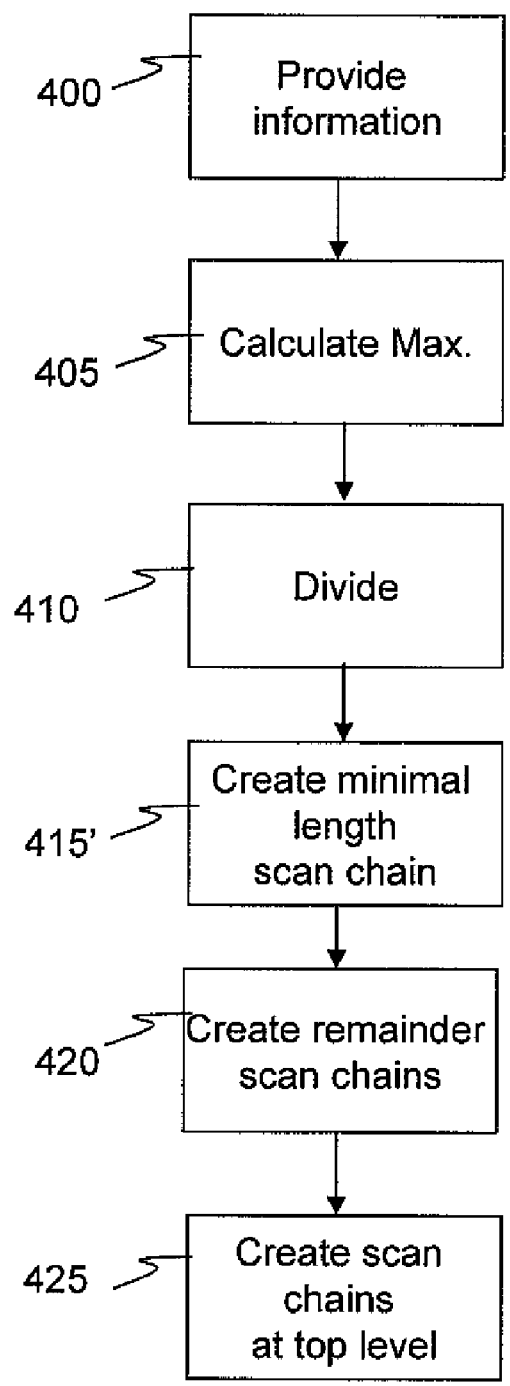
FIG. 4 is a flow chart implementing alternative embodiments in accordance with embodiments of the invention.

FIGS. 2-4 represent flow diagrams implementing processes of various embodiments of the invention. The processes of FIGS. 2-4 may be implemented in the environment of FIG. 1. The processes of FIGS. 2-4 may equally represent a high-level block diagram of the invention.

The invention can take the form of an entirely hardware embodiment, an entirely software embodiment or an embodiment containing both hardware and software elements. The hardware and software elements may be representative of the environment of FIG. 1. The software elements may be firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

In embodiments, the invention can be provided by a service provider which creates, maintains, deploys, supports, etc., a computer infrastructure that performs the process steps of the invention for one or more customers. In return, the service provider can receive payment from the customer(s).

Referring now to FIG. 2, at step 200, given information about the design of the hierarchically designed integrated circuit, the process calculates or estimates the maximum length of the scan chain for each block in the hierarchically designed integrated circuit The information about the design may include, for example, number of scan bits, number of scan chains, balancing criterium, etc.

At step 205, for each of the blocks, the process of the invention creates as many scan chains as possible of the maximum length. That is, the process creates a maximum number of scan chains of length L in each hierarchical block.

At step 210, the remaining scan bits in each block are distributed among smaller scan chains, for that block. In embodiments, the smaller scan chains are smaller than the maximum length of the scan chain for each block in the hierarchically designed integrated circuit. In embodiments, tool "2", described above, can be used to create the smaller scan chains.

At step 215, the chip level scan chains are created by stitching together the smaller scan chains into longer scan chains at the chip level of the hierarchically designed integrated circuit, using an existing scan-insertion tool. For example, in one embodiment, the chip-level scan chains are created by distributing scan segments of maximum length LR among a minimum number of additional chip-level chains of maximum length L. In this manner, the scan chains can be balanced in the hierarchically designed integrated circuit.

FIG. 3 shows a preferred embodiment implementing processes in accordance with the present invention. At step 300, information is provided to the tool, which relates to the design of the hierarchically designed integrated circuit. By way of example, the following information is provided in accordance with the invention:

T: total number of scan bits in the entire design;
N: desired number of scan chains to be inserted into the design;
F: target scan-balancing factor (also referred to herein as a "load balancing factor") for the design;

$B_i$: total number of scan bits in a hierarchical block; and
LR: maximum length of the "remainder scan chains".

In embodiments, the designations "T", "N", "F", "$B_i$" and "LR" are arbitrary designations and should not be considered a limiting feature of the invention. As to the designation $B_i$, "i" represents the number of hierarchical blocks, where i=1, 2, ..., "m" and "m" is the number of hierarchical block instances.

In embodiments, the target scan balance can be about 3%. By way of example, F=1.03 if the longest scan chain is no more than 3% above an average. It should be realized, though, that other target scan balances are also contemplated by the invention such as ranges of 3% to 5%, 1% to 3% and even 1% to 2%, as examples. In embodiments, the target scan balance can be upwards of about 10% or any percentage or range upwards of about 10%.

Many different factors may be taken into account when determining the load balancing factor. For example, factors that may be taken into account include the maximum length set for each scan chain as well as the number of scan chains which are to be created. As a non-limiting illustration, if the maximum length of a scan chain is set to 1000 scan bits, it may be desirable to use a load balancing factor of 3% to 5%; however, if the maximum length of the scan chain is set to 100 scan bits, it may be more desirable to load factor of 1%-2%.

At step 305, the process calculates the maximum scan chain length, L. In one embodiment, the maximum scan chain length is calculated using the following equation:

$$L=(T/N) \times F \qquad (1)$$

At step 310, for each hierarchical block i (i=1, 2, ..., m), the total number of scan bits $B_i$ is divided by the maximum scan chain length L, resulting in a number of scan chains for each block. The number of scan chains will be an integer, e.g., $M_i$. In most situations, due to the number of scan bits in some or all blocks, a number of scan bits will remain, e.g., $R_i$, after the number of scan bits $B_i$ is divided by the maximum scan chain length "L". By way of example, if L=2060 and $B_i$=20,000, then $M_i$=9 and $R_i$=1460.

At step 315, the process creates Mi scan chains on the hierarchical block with lengths as close to, but not exceeding, the maximum length L. The maximum length L may be dependent on many different variables including, for example, the number of scan bits in the block. In embodiments, the maximum length already includes the target scan balance percentage, e.g., a load balancing factor of 3%-5%.

At step 320, the process creates additional "remainder scan chains" on the hierarchical block which, in embodiments, do not exceed length LR. In embodiments, the length LR can be set to about 10% of the maximum length; although, other percentages or fixed numbers of scan bits are also contemplated by the invention, depending on, e.g., the initial set maximum length. The process of step 320 is, repeated for each block in the hierarchal design.

In one embodiment, any remaining scan bits $R_i$ can be distributed equally to create the "remainder scan chains"; although, the invention further contemplates other distributions. The process of distributing the remaining scan bits $R_i$ into scan chains of approximately equal length can be accomplished with existing scan-insertion tools. If the hierarchical design block has Mi scan chains inserted at step 315 and the scan insertion tool is "told" to insert Ji scan chains (Ji>Mi), the tool will distribute the remaining Ri scan bits into Ji-Mi scan chains, leaving the existing Mi scan chains unchanged.

In an alternative approach, the invention further contemplates that the remaining scan bits $R_i$ can be distributed in other ways (e.g., unequally) into the "remainder scan chains".

In this approach, it is preferable, although not required, that each of the resulting remainder scan chains be within a certain variance (e.g., balanced load factor). For example, the target scan load balance of the "remainder scan chains" may be about 3%-5%; although, other target scan load balances are also contemplated by the invention. Also, in embodiments, it is preferable to minimize the number of remainder scan chains. Also, in further embodiments, none of the distributions of the "remainder scan chains", regardless of the distribution method, should exceed length LR (in addition to the load balance factor, in embodiments).

By way of non-limiting illustration of step 320, if LR=400 and $R_i$=1460, the remaining scan bits $R_i$ can be distributed equally into four equal scan chains of length 365. Although it is preferred to have equal lengths, in another non-limiting illustration of step 320, if LR=400 and $R_i$=1460, the scan bits can be divided into four groups with different lengths. For example, groups "A", "B" and "C" can each have a maximum length of 400 and group "D" can have a length of 260. In any of distribution scheme, it is preferred to minimize the number of created remainder scan chains. This being the case, using the above example, it would be preferable to create only four groups.

At step 325, the process of the invention creates the scan chains, at the top level, using existing tools. By way of example, if tool "1" is used, the user will specify to the tool that "N" number of scan chains are to be created. If tool "2" is to be used, the user will specify to the tool that scan chains of maximum length L are to be created. In embodiments, the total number of scan chains created may be less than "N", where the number of scan chains created is equal to roundup (T/L) which is also equal to roundup(N/F). Thus, for example, in one embodiment, the chip-level scan chains can be created by distributing scan segments of maximum length LR among a minimum number of additional chip-level chains of maximum length L.

FIG. 4 shows an alternative embodiment implementing processes in accordance with the present invention. The processing steps of FIG. 4 are substantially the same as that shown and described with reference to FIG. 3 with a variation to step 315, now designated as step 415'.

More specifically, at step 400, information is provided to the tool, which relates to the design of the hierarchically designed integrated circuit. This information may be the same information as disclosed with reference to the process step 300, including the same or similar embodiments. At step 405, the process calculates the maximum scan chain length using equation (1).

At step 410, for each hierarchical block i (i=1, 2, ..., m), the total number of scan bits $B_i$ is divided by the maximum scan chain length "L", resulting in a number of scan chains for each block. The number of scan chains will be an integer, e.g., $M_i$, with a remainder $R_i$.

At step 415', the process of the invention calculates a minimum length ML of the scan chain using equation (2), as shown below, $$ML=T/N \qquad (2)$$

In one embodiment, the minimum length ML is calculated because of pre-connected scan segments in the hierarchal design. Additionally, as with the maximum length, the minimum length ML may also include the target scan balance percentage, e.g., a load balancing factor of 3%-5%. In addition, in this processing step, the process creates $M_i$ scan chains on the hierarchical block with lengths as close to, but not exceeding, the maximum length L.

In this manner, the process of step 415' is refined to create $M_i$ scan chains on the hierarchical block at least as large as a specified minimum length ML, but not exceeding the maximum length L. Again, the maximum length, L, is dependent on many different variables including, for example, the number of scan bits in the block and, in embodiments, already includes the target scan balance percentage, e.g., a load balancing factor of 3%-5%.

At step 420, the process creates additional "remainder scan chains" on the hierarchical block which, in embodiments, do not exceed length LR. The process of step 420 is repeated for each hierarchal block in the design. Step 420 may implement the various embodiments discussed with reference to 320, and are thus not discussed further herein.

At step 425, the process of the invention creates the scan chains at the top level using existing tools. By way of example, if tool "1", is used, the user will specify to the tool that N number of scan chains are to be created. If tool "2" is to be used, the user will specify to the tool that scan chains of maximum length "L" are to be created. In embodiments, the total number of scan chains created may be less than N, where the number of scan chains created is equal to roundup(T/L) which is also equal to roundup(N/F).

Example of Use

In an illustrative example, an excessive number of scan pins are typically required on each hierarchical block. For example, a hierarchical block with 20,000 scan bits in a design that is to have 500 scan chains would be required to have 1000 scan pins using process "1" or 100 scan pins using process "2" (with a limit of 400 bits per chain). However, by implementing the system and methods of the invention, the same hierarchical block of 20,000 scan bits, on a chip with a total of 1 million scan bits distributed among 500 scan chains, would require no more than 26 scan pins (13 scan chains), if balanced within 3% (F=1.03) and remainder scan chains are limited to maximum length LR=400, and could have as few as 20 scan pins (10 scan chains) for the hierarchical block.

In another example, using the processes of FIG. 3, the tool is provided with the following information:
- total number of scan bits in the chip is T=400,000
- desired number of scan chains is N=400
- target scan-balancing factor F=1.03
- each scan chain should be a maximum length of L=(T/N)× F=1030 scan bits, and
- block A has 103,000 scan bits, block B has 257,000 scan bits, block C has 29,000 scan bits, module (block) D has 10,000 scan bits, and there are 1000 scan bits at the top level of the design.

For each hierarchical block i (i=1, 2, . . . , m), the total number of scan bits is divided by the maximum scan chain length, resulting in a number of scan chains for each block. In this example,
- block A has 100 scan chains;
- block B has 249 scan chains, with a remainder of 530 scan bits;
- block C has 28 scan chains, with a remainder of 160 scan bits; and
- block D has 9 scan chains, with a remainder of 730 scan bits.

The remainder scan bits in blocks B, C, and D are used to create additional "remainder scan chains" on the hierarchical block which, in embodiments, do not exceed a length LR. In this illustration, the length LR is set at 100 scan bits, which is approximately 10% of the size of maximum length of 1030. For block C, this results in two additional scan chains, each of equal length of 80 scan bits. However, each of these scan chains can be of different lengths, e.g., a first scan chain of 100 scan bits and a second scan chain of 60 scan bits. Blocks B and D have 6 and 8 additional scan chains, respectively, each with maximum length 100.

The example continues with creating the scan chains, at the top level, using existing tools. By way of example, using tool "1", the user will specify to the tool that N (400) scan chains are to be created. If using tool "2", the user will specify to the tool that scan chains of maximum length L (1030) are to be created. Either tool will create 386 scan chains of length 1030, utilizing the 100 scan chains from block A, 249 scan chains from block B, 28 scan chains from block C, and 9 scan chains from block D. Tool "1" will attempt to distribute the remaining 2420 scan bits (e.g., 530 from block B, 160 from block C, 730 from block D, and 1000 from the top level) among 14 additional scan chains, achieving a total of 400 scan chains with average length 1000. Tool "2" will attempt to distribute the remaining 2420 scan bits into as few scan chains as possible, subject to the maximum specified length of 1030, achieving as few as 389 scan chains.

Semiconductor Devices

The system and method as described herein may be used in the manufacture and/or testing of semiconductor devices. The semiconductor devices may be part of the design for an integrated circuit chip. In embodiments, the chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed:

1. A method for inserting balanced-length scan chains into hierarchically designed integrated circuits, comprising:

estimating or calculating a maximum scan chain length L;
creating a maximum number of scan chains of length L in each hierarchical block;
distributing any remaining scan bits in each hierarchical block into additional scan chains of maximum length LR which is less than L; and
creating chip-level scan chains by using the scan chains of maximum length L and by forming additional chip-level scan chains of maximum length L by distributing the additional scan chains of maximum length LR, plus any remaining top-level scan bits, among the additional chip-level scan chains of maximum length L.

2. The method of claim 1, wherein the estimating or calculating is provided for each block in the hierarchically designed integrated circuit.

3. The method of claim 1, wherein the estimating or calculating uses information about a design of the hierarchically designed integrated circuit to estimate or calculate the maximum scan chain length L.

4. The method of claim 3, wherein the information includes at least one of number of scan bits, number of scan chains and balancing criterium.

5. The method of claim 1, further comprising creating a minimum number of additional chip-level scan chains of maximum length L.

6. The method of claim 1, wherein the additional chip-level scan chains of maximum length L are created by dividing the remaining scan bits equally or substantially equally among a desired number of scan chains.

7. The method of claim 1, wherein the maximum scan chain length L is no more than a predetermined percentage of an average length.

8. The method of claim 1, wherein the scan chain length L is balanced in the hierarchically designed integrated circuit.

9. A method comprising:
calculating a maximum scan chain length L;
dividing a total number of scan bits $B_i$ by the maximum scan chain length L for each hierarchical block i (i=1, 2, ..., m) to create $M_i$ scan chains;
creating remainder scan chains from scan bits $R_i$ remaining from the dividing; and
stitching together the scan chains and the remainder scan chains at a top level to form stitched scan chains not exceeding a maximum length.

10. The method of claim 9, wherein the stitching comprises specifying "N" number of scan chains to be created at the top level.

11. The method of claim 9, wherein the stitching comprises specifying a maximum length of the scan chains to be created at the top level.

12. The method of claim 11, wherein a total number of scan chains created is equal to a rounding up of a total number of scan bits in an entire design divided by the maximum scan chain length L.

13. The method of claim 9, wherein the $M_i$ scan chains have lengths as close to, but not exceeding, the maximum scan chain length L.

14. The method of claim 9, wherein the maximum scan chain length L is load balanced.

15. The method of claim 9, further comprising providing a total number of scan bits in a hierarchical block ($B_i$) and a maximum length of remainder scan chains (LR).

16. The method of claim 9, wherein the remainder scan chains do not exceed a predetermined length LR.

17. The method of claim 9, wherein the remaining scan bits $R_i$ are distributed equally or substantially equally to create the remainder scan chains.

18. The method of claim 9, further comprising determining a maximum length for each of the remainder scan chains $R_i$ and minimizing a number of the remainder scan chains.

19. The method of claim 9, wherein the calculating is based on equation $L=(T/N) \times F$, wherein:
T=total number of scan bits in the entire design;
N=desired number of scan chains to be inserted into the design; and
F=target scan-balancing factor for the design.

20. The method of claim 9, wherein the dividing step further comprises calculating a minimum length ML of the scan chain using equation $ML=T/N$, wherein:
T=total number of scan bits in the entire design; and
N=total number of scan chains to be inserted into the design.

21. The method of claim 20, wherein the minimum length ML includes a load balancing factor.

22. The method of claim 9, wherein the steps are used to manufacture semiconductor devices.

23. A system for inserting balanced-length scan chains into hierarchically designed integrated circuits, comprising:
a computer infrastructure operable to:
calculate a maximum scan chain length L of scan bits;
create Mi scan chains of the maximum scan chain length L, which results in a remaining number of scan bits;
create remainder scan chains from the remaining number of scan bits; and
stitch together the scan chains and the remainder scan chains at a top level.

24. The system of claim 23, wherein the computer infrastructure is operable to specify a maximum length of the scan chains to be created at the top level.

25. The system of claim 23, wherein the computer infrastructure is operable to create a total number of scan chains equal to a rounding up of a total number of scan bits in an entire design divided by L.

26. The system of claim 23, wherein the computer infrastructure is operable to create the $M_i$ scan chains which lengths as close to, but not exceeding, the maximum scan chain length L.

27. The method of claim 23, wherein the computer infrastructure is operable to load balance the maximum scan chain length L.

28. A computer program product comprising a non-transitory computer usable storage medium having a computer readable program embodied in the storage medium, wherein the computer readable program when executed on a computing device is operable such that the computing device can:
estimate or calculate a maximum scan chain length L;
create a maximum number of scan chains of length L in each hierarchical block;
distribute remaining scan bits in each hierarchical block into additional scan chains; and
create chip-level scan chains by distributing scan segments of maximum length LR among a minimum number of additional chip-level chains of maximum length L using the scan chains of length L and the additional scan chains.

* * * * *